（12） United States Patent
Habu et al.

(10) Patent No.: US 11,658,652 B2
(45) Date of Patent: May 23, 2023

(54) SEMICONDUCTOR DEVICE

(71) Applicant: Mitsubishi Electric Corporation, Tokyo (JP)

(72) Inventors: Yo Habu, Tokyo (JP); Akihisa Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 196 days.

(21) Appl. No.: 17/073,566

(22) Filed: Oct. 19, 2020

(65) Prior Publication Data

US 2021/0184668 A1 Jun. 17, 2021

(30) Foreign Application Priority Data

Dec. 12, 2019 (JP) .............................. JP2019-224421

(51) Int. Cl.

| H03K 3/00 | (2006.01) |
| H03K 17/081 | (2006.01) |
| H03K 17/082 | (2006.01) |
| H03K 17/16 | (2006.01) |
| H03K 17/687 | (2006.01) |
| H03K 17/0812 | (2006.01) |

(52) U.S. Cl.
CPC ..... *H03K 17/08122* (2013.01); *H03K 17/687* (2013.01)

(58) Field of Classification Search
None
See application file for complete search history.

(56) References Cited

U.S. PATENT DOCUMENTS 5,113,089 A     5/1992   Osawa
5,621,601 A  *  4/1997   Fujihira ............. H03K 17/0828
                                                                361/115

(Continued)

FOREIGN PATENT DOCUMENTS

JP     03-1 05262 A     5/1991
JP     05-1 46049 A     6/1993

(Continued)

OTHER PUBLICATIONS

An Office Action; "Notice of Reasons for Refusal," mailed by the Japanese Patent Office dated Feb. 7, 2023, which corresponds to Japanese Patent Application No. 2019-224421 and is related to U.S. Appl. No. 17/073,566; with English language translation.

*Primary Examiner* — Kenneth B Wells
(74) *Attorney, Agent, or Firm* — Studebaker & Brackett PC

(57) ABSTRACT

The detection circuit includes a current source and a resistor element which are connected in series via a first node between a positive electrode and a negative electrode of a switching element which is turned on and off by a driving circuit. The voltage comparator outputs a detection signal indicating a comparison result between an input DC voltage and the voltage of the first node. The DC voltage and the electric resistance value of the resistor element are set in such manner that when an inter-electrode voltage between the positive electrode and the negative electrode becomes higher than a predefined determination voltage, the voltage of the first node is higher than the DC voltage. The detection circuit and the voltage comparator are mounted on the same integrated circuit constituting the semiconductor device.

11 Claims, 7 Drawing Sheets

(56) References Cited

U.S. PATENT DOCUMENTS

| | | | |
|---|---|---|---|
| 6,194,885 B1* | 2/2001 | Oshima | H02M 1/4225 |
| | | | 363/39 |
| 7,986,149 B2* | 7/2011 | Covalenco | G01R 31/52 |
| | | | 324/555 |
| 8,963,524 B2* | 2/2015 | Hamanaka | H03K 17/081 |
| | | | 323/311 |
| 9,094,005 B2* | 7/2015 | Miura | H03K 17/167 |
| 9,548,299 B2* | 1/2017 | Jonishi | H01L 29/866 |
| 9,748,942 B2* | 8/2017 | Akahane | H03K 17/0828 |
| 10,116,302 B1 | 10/2018 | Murakami et al. | |
| 10,728,960 B2* | 7/2020 | Bredemeier | H01L 27/0255 |
| 11,082,039 B2* | 8/2021 | Chen | H03K 17/163 |

FOREIGN PATENT DOCUMENTS

| | | | |
|---|---|---|---|
| JP | 2007-019728 A | 1/2007 | |
| JP | 2019-004535 A | 1/2019 | |

* cited by examiner

SEMICONDUCTOR DEVICE

BACKGROUND OF THE INVENTION

Field of the Invention

The present disclosure relates to a semiconductor device.

Description of the Background Art

Generally, an inverter or the like adopts a so-called arm configuration in which two semiconductor switching elements (hereinafter simply referred to as "switching elements") are connected via an intermediate potential node between a high potential node and a low potential node. Hereinafter, in the arm configuration, one switching element that is connected to the high potential side is referred to as a high-side switching element, and the other switching element that is connected to the low potential side is referred to as a low-side switching element.

Japanese Patent Laying-Open No. 2019-4535 discloses a semiconductor device that includes a detection circuit configured to detect a state of the high-side switching element in the arm configuration. As disclosed in Japanese Patent Laying-Open No. 2019-4535, the state of the high-side switching element is monitored by a detection circuit and a signal transmission circuit, each of which includes circuit elements provided outside a semiconductor chip (IC: Integrated Circuit) mounted with a driving circuit for driving the high-side switching element and the low-side switching element, each of which is constituted by an IGBT (Insulated Gate Bipolar Transistor).

As disclosed in Japanese Patent Laying-Open No. 2019-4535, the detection circuit outputs a voltage in response to the state of the high-side switching elements, and the signal transmission circuit includes a signal switching element which is mounted on the semiconductor chip and configured to turn on and off in response to the voltage output from the detection circuit, and a diode which is arranged outside the semiconductor chip and connected in series with the signal switching element. This makes it possible to monitor the voltage output from the detection circuit while ensuring the required insulation between the high-side switching element and the low-side switching element by the diode.

SUMMARY OF THE INVENTION

However, according to the configuration disclosed in Japanese Patent Laying-Open No. 2019-4535, since the required insulation between the high-side switching element and the low-side switching element is ensured by a diode connected to the IC from the outside, the state of the switching element is monitored by the elements mounted on the IC and the element provided outside the IC, which thereby increases the number of components and the size of the circuit.

On the other hand, it is known that when an overcurrent flows through a switching element, the switching element is brought into an unsaturated state, which causes the occurrence of a voltage abnormality which means that even if the switching element is in the ON state, the voltage between the positive electrode and the negative electrode may become abnormally high. Therefore, it is important to detect the voltage abnormality so as to prevent an overcurrent from continuously flowing through the switching element. However, in this case, it is desired to detect the voltage abnormality with a simple circuit configuration to replace the complicated circuit configuration as disclosed in Japanese Patent Laying-Open No. 2019-4535.

An object of the present disclosure is to provide a semiconductor device capable of detecting a voltage abnormality between a positive electrode and a negative electrode when a switching element is turned on while ensuring insulation with a simple configuration.

According to an aspect of the present disclosure, a semiconductor device includes a detection circuit connected between a positive electrode and a negative electrode of a semiconductor switching element, and a voltage comparator. The detection circuit includes a current source and a first resistor element having a first electrical resistance value. The current source and the first resistor element are connected in series via a first node between the positive electrode and the negative electrode. The voltage comparator outputs a comparison result between a DC voltage input to a second node and a voltage of the first node. The DC voltage and the first electrical resistance value are set in such a manner that when the inter-electrode voltage between the positive electrode and the negative electrode becomes higher than a predefined determination voltage, the voltage of the first node is higher than the DC voltage. The detection circuit and the voltage comparator are mounted on the same integrated circuit.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
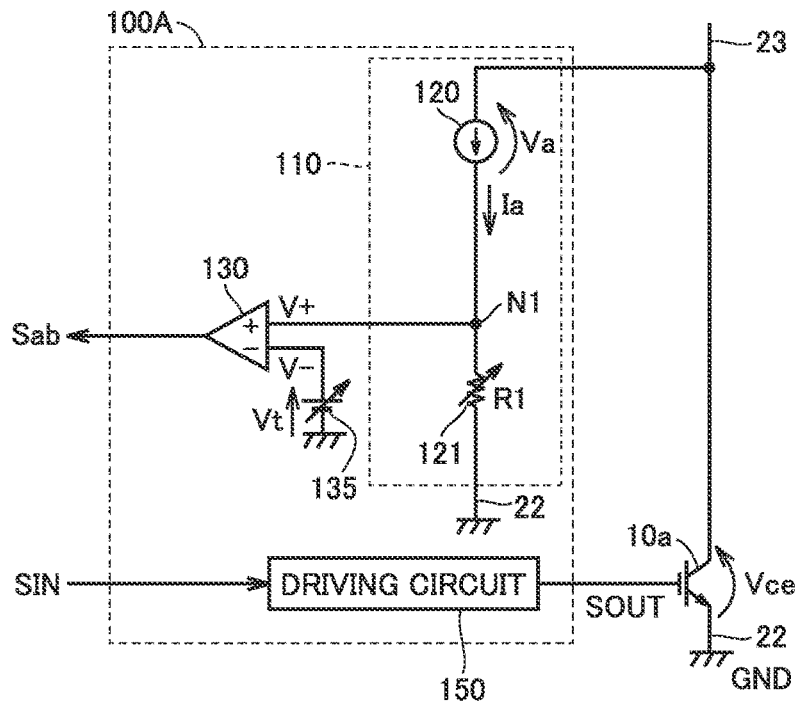
FIG. 1 is a first circuit diagram illustrating a configuration of a semiconductor device according to a first embodiment.

Hereinafter, embodiments of the present disclosure will be described in detail with reference to the drawings. In the following description, the same or corresponding portions in the drawings are denoted by the same reference numerals, and the description thereof will not be repeated.

First Embodiment

Figure 2:
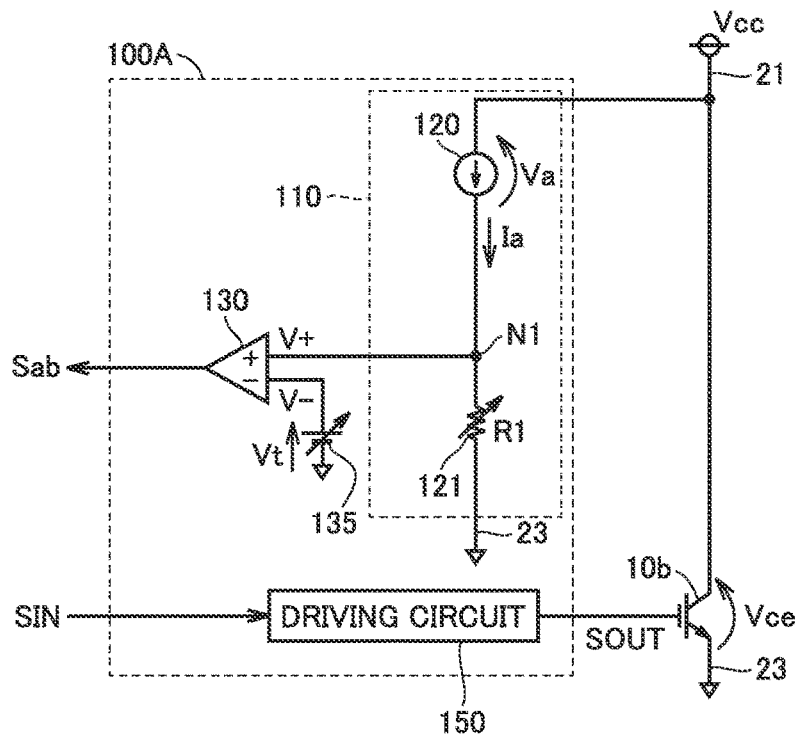
FIG. 2 is a second circuit diagram illustrating the configuration of the semiconductor device according to the first embodiment.

FIGS. 1 and 2 each is a circuit diagram illustrating a configuration of a semiconductor device according to a first embodiment.

With reference to FIG. 1, a semiconductor device 100A functions as a driving IC for a switching element 10a. The switching element 10a which is turned on and off by the semiconductor device 100A is typically constituted by an IGBT, and is connected between an intermediate potential node 23 and a low potential node 22 to which a low potential GND is supplied. In other words, the switching element 10a represents a low-side switching element.

With reference to FIG. 2, the semiconductor device 100A functions as a driving IC for a switching element 10b. The switching element 10b which is turned on and off by the semiconductor device 100A is typically constituted by an IGBT, and is connected between a high potential node 21 to which a high potential Vcc is supplied and the intermediate potential node 23 which is common to FIG. 1. In other words, the switching element 10b represents a high-side switching element.

As illustrated in FIGS. 1 and 2, since the configuration of the semiconductor device 100A (FIG. 1) provided for the low-side switching element 10a and the configuration of the semiconductor device 100A (FIG. 2) provided for the high-side switching element 10b are the same, hereinafter, the configuration of the semiconductor device 100A provided for the low-side switching element will be described in detail.

With reference to FIG. 1 again, the semiconductor device 100A includes a driving circuit 150 for the switching element 10a, a detection circuit 110 for detecting a collector-emitter voltage (Vce) of the switching element 10a, and a voltage comparator 130. Vce is equivalent to the voltage between the positive electrode and the negative electrode of the switching element.

The driving circuit 150 receives a control signal SIN of the switching element 10a, and outputs a gate signal SOUT to the gate (control electrode) of the switching element 10a. For example, when the control signal SIN, which is a binary signal, is at a high level (hereinafter referred to as "H level"), if the gate signal SOUT is set to the H level, the switching element 10a is turned on. The H level voltage of the gate signal SOUT is set higher than a threshold voltage of the IGBT constituting the switching element 10a with respect to the negative electrode (emitter) of the switching element 10a.

On the other hand, when the control signal SIN is at a low level (hereinafter referred to as "L level"), if the gate signal SOUT is set to the L level, the switching element 10a is turned off. For example, the L level voltage of the gate signal SOUT is set equal to the voltage of the negative electrode (emitter) of the switching element 10a, in other words, the low potential GND.

The detection circuit 110 includes a current source 120 and a resistor element 121 which are connected in series. The resistor element 121 is preferably constituted by a variable resistor element. For example, an electric resistance value R1 of the resistor element 121 may be adjusted by digital trimming.

The current source 120 and the resistor element 121 are connected in series via a node N1 between the intermediate potential node 23 and the low potential node 22, in other words, between the positive electrode (collector) and the negative electrode (emitter) of the switching element 10a.

The voltage comparator 130 outputs a detection signal Sab in response to a comparison result between the voltage V+ of the positive input terminal and the voltage V− of the negative input terminal. The detection signal Sab is set to the H level when V+>V−, and is set to the L level when V+<V−.

The positive input terminal of the voltage comparator 130 is connected to the node N1 of the detection circuit 110. In other words, the voltage V+ is equivalent to the voltage of the node N1. On the other hand, a voltage source 135 that supplies a DC voltage Vt is electrically connected between the negative input terminal of the voltage comparator 130 and the low potential node 22 (the emitter of the switching element 10a). It is preferable that the voltage source 135 is configured to variably adjust the DC voltage Vt. The node N1 corresponds to an embodiment of a "first node", and the negative input terminal of the voltage comparator 130 corresponds to an embodiment of a "second node". The collector-emitter voltage Vce of the switching element corresponds to an embodiment of an "inter-electrode voltage", and the resistor element 121 of the detection circuit 110 corresponds to an embodiment of a "first resistor element".

The current source 120 may be constituted by, for example, a diode-connected high breakdown voltage transistor provided on an IC constituting the semiconductor device 100A. In the example configuration of FIG. 1, the current source 120 is connected between the intermediate potential node 23 (the collector of the switching element 10a) and the node N1. The resistor element 121 is connected between the node N1 and the low potential node (the emitter of the switching element 10a). The resistor element 121 is also formed on the IC constituting the semiconductor device 100A.

The voltage comparator 130 may be constituted from any circuit configuration. For example, if the voltage comparator 130 is constituted by using a transistor, a resistor element and the like provided on the IC constituting the semiconductor device 100A, the voltage comparator 130 may be mounted on the IC constituting the semiconductor device 100A in the same way as the detection circuit 110.

On the other hand, the voltage source 135 may be disposed outside the semiconductor device 100A (IC). In this case, the DC voltage Vt is supplied from the outside of the semiconductor device 100A to a terminal (not shown) electrically connected to the negative input terminal of the voltage comparator 130. Alternatively, a circuit that generates a constant voltage by reducing the high potential Vcc using a transistor or the like on the semiconductor device 100A is used as the voltage source 135.

As described in the above, it is known that when a switching element (IGBT) in the ON state encounters an overcurrent, the switching element is brought into the unsaturated state, and thereby, the collector-emitter voltage Vce may not be sufficiently lowered even if the switching element is in the ON state. In the semiconductor device according to the present embodiment, the detection circuit 110 and the voltage comparator 130 are configured to detect the unsaturated state of the switching element 10a (IGBT). Specifically, during the H level period of the control signal SIN, when the collector-emitter voltage Vce is higher than the determination voltage Vth, the voltage comparator 130 sets the detection signal Sab to the H level, and thereby the unsaturated state is detected. The determination voltage Vth may be set lower than the collector-emitter voltage Vce in the unsaturated state by a margin based on the characteristics of the switching element 10a. Generally, the determination voltage Vth is less than 10 V.

Figure 3:
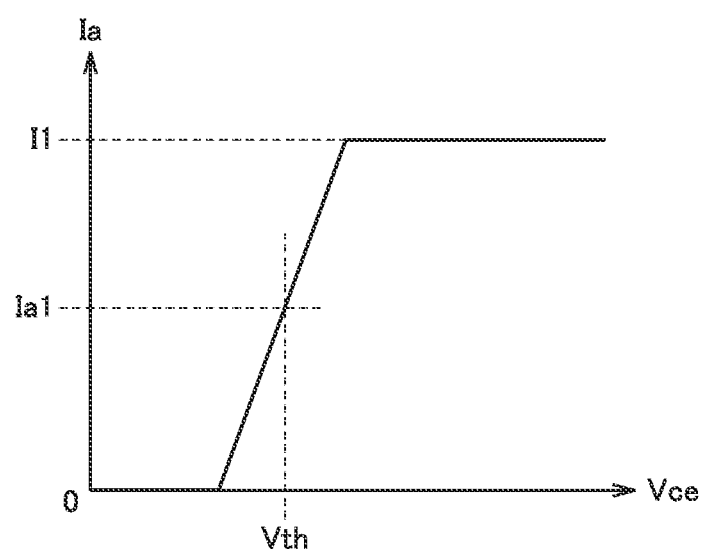
FIG. 3 is a conceptual diagram illustrating a voltage-current relationship of the detection circuit illustrated in FIG. 1.

FIG. 3 illustrates a voltage-current relationship of the detection circuit 110.

With reference to FIG. 3, in a region where the collector-emitter voltage Vce of the switching element 10a is low, the output current Ia of the current source 120 satisfies Ia=0, while in a region where the collector-emitter voltage Vce is high, the output current Ia of the current source 120 exhibits a saturated constant value (Ia=I1). In the Vce region including the determination voltage Vth, the output current Ia varies in proportion to the collector-emitter voltage Vce in accordance with a slope which is a reciprocal of the electric resistance value R1 (of the resistor element 121).

If the voltage of the current source 120 is represented by Va1 and the current thereof is represented by Ia1 at the time when Vce=Vth, the determination voltage Vth, the voltage Va1 and the current Ia1 satisfy the following expression (1):

$$Vth=Va1+R1 \times Ia1 \quad (1)$$

If the DC voltage Vt is expressed by using the current Ia1 in the expression (1) as the following expression (2), when Vce>Vth, the voltage comparator 130 may set the output (detection signal Sab) to the H level.

$$Vt=R1 \times Ia1 \quad (2)$$

Based on the expressions (1) and (2), the determination voltage Vth may be expressed by the following expression (3):

$$Vth=Va1+Vt \quad (3)$$

As seen from the expression (3), the determination voltage Vth may be adjusted by the electric resistance R1 of the resistor element 121 and the DC voltage Vt from the voltage source 135. In other words, the determination voltage Vth may be adjusted according to the characteristics of the switching element 10a to be monitored for the voltage abnormality.

Figure 4:
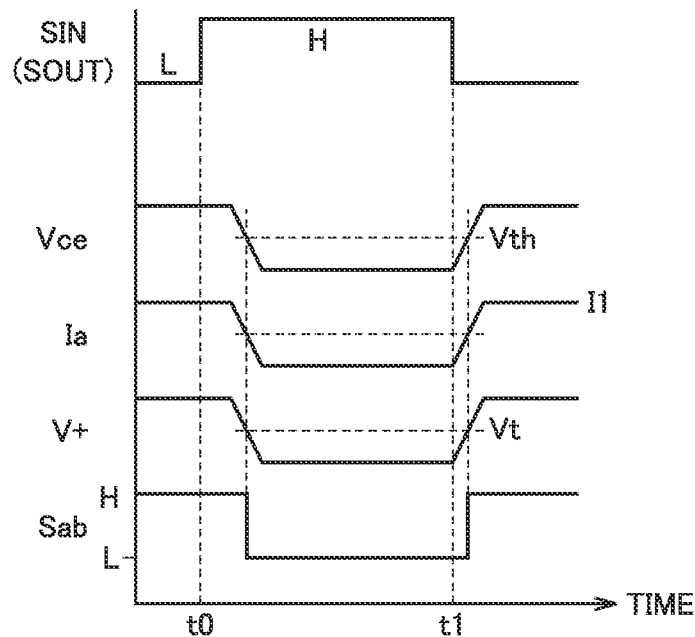
FIG. 4 is a first waveform diagram illustrating an example operation of the semiconductor device according to the first embodiment.
Figure 5:
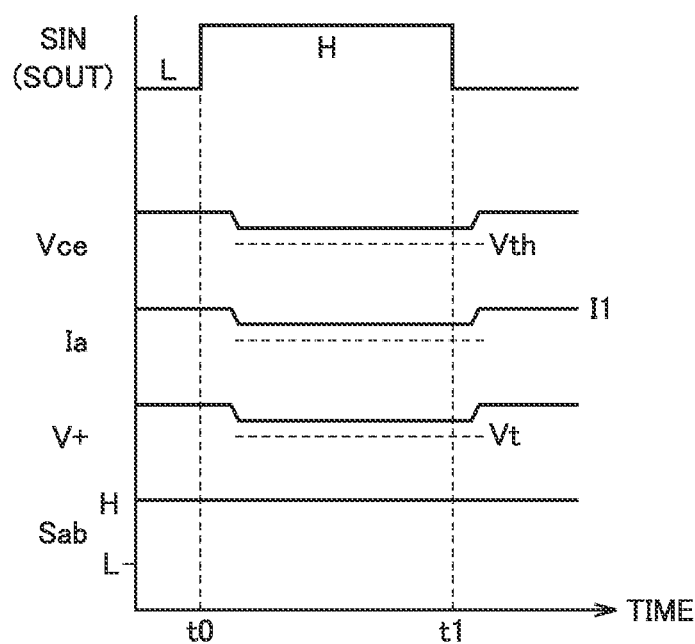
FIG. 5 is a second waveform diagram illustrating an example operation of the semiconductor device according to the first embodiment.

FIGS. 4 and 5 illustrate example operations of the semiconductor device according to the first embodiment. FIG. 4 illustrates an example waveform diagram during the normal operation of the switching element 10a.

With reference to FIG. 4, before time t0, since the control signal SIN is set to the L level, the low-side switching element 10a is in the OFF state. At this time, since the high-side switching element 10b is normally in the ON state, Vce=Vcc, and thereby Vce>Vth. In the detection circuit 110, as described with reference to FIG. 3, Ia=I1. In the voltage comparator 130, since Vce>Vth, thus V+>V−, and thereby, when the switching element 10a is in the OFF state, the detection signal Sab is at the H level.

When the control signal SIN is changed from the L level to the H level at time t0, the switching element 10a is turned on. Specifically, the gate voltage of the switching element 10a is raised as the gate signal SOUT output from the driving circuit 150 is changed to the H level. Thus, the collector-emitter voltage Vce decreases, and a collector-emitter current begins to flow in the switching element 10a.

If the switching element 10a is in the normal ON state, no unsaturated state occurs in the switching element 10a, and thereby, the collector-emitter voltage Vce decreases to a voltage near zero, and a normal collector-emitter current is generated. In other words, the collector-emitter voltage Vce decreases lower than the determination voltage Vth.

In response to such a decrease in the collector-emitter voltage Vce, in the detection circuit 110, the output current Ia from the current source 120 becomes equal to 0 (Ia=0), and in the voltage comparator 130, V+<V−. As a result, the detection signal Sab is changed to the L level.

When the control signal SIN is changed from the H level to the L level at time t1, the switching element 10a is turned off. Thereby, Vce, Ia, V+ and the detection signal Sab return to the state before time t0. Thus, when the switching element 10a is in the normal ON state, if the control signal SIN is changed to the H level, the detection signal Sab is changed to the L level.

On the other hand, FIG. 5 illustrates an example operation when an unsaturated state occurs in the switching element 10a. With reference to FIG. 5, similarly to FIG. 4, when the control signal SIN is changed from the L level to the H level at time t0, the switching element 10a is turned on.

However, in FIG. 5, an unsaturated state occurs in the switching element 10a due to an excessive collector-emitter current (overcurrent state), which causes the occurrence of a voltage abnormality, and thereby Vce does not decrease as illustrated in FIG. 4. Due to the voltage abnormality, Vce>Vth, and thereby, in response to the output current Ia in accordance with the relationship in FIG. 3, V+>V−. As a result, unlike FIG. 4, even if the control signal SIN is changed to the H level, the detection signal Sab is maintained at the H level.

Therefore, it is possible for the semiconductor device 100A according to the first embodiment to detect the occurrence of an unsaturated state during the ON period of the switching element 10a based on the detection signal Sab generated by the detection circuit 110 and the voltage comparator 130.

When the switching element 10a is turned off, the insulation of the detection circuit 110 between the intermediate potential node 23 to which the high potential Vcc is applied and the low potential node 22 may be ensured by the current source 120 (for example, a diode-connected high breakdown voltage field effect transistor). In other words, it is possible to ensure the insulation of the detection circuit 110 by using an element (for example, the high breakdown voltage field effect transistor) provided on the IC constituting the semiconductor device 100A including the driving circuit 150 instead of using an external element provided outside the IC such as that disclosed in Japanese Patent Laying-Open No. 2019-4535.

With reference to FIG. 2 again, the semiconductor device 100A may be applied to the high-side switching element 10b with the same circuit configuration as that of FIG. 1. In this case, the high potential node 21 in the circuit configuration of FIG. 2 corresponds to the intermediate potential node 23 in FIG. 1, and the intermediate potential node 23 in the circuit configuration of FIG. 2 corresponds to the low potential node 22 in FIG. 1.

In FIG. 2, the detection circuit 110 is connected between the high potential node 21 and the intermediate potential node 23, in other words, between the collector and the emitter of the switching element 10b, which makes it possible to detect the collector-emitter voltage Vce of the high-side switching element 10b. In other words, the output current Ia of the current source 120 and the collector-emitter voltage Vce of the switching element 10b satisfy the same relationship as illustrated in FIG. 3.

The positive input terminal of the voltage comparator 130 is connected to the node N1 of the detection circuit 110 as in FIG. 1. On the other hand, the voltage source 135 is electrically connected between the intermediate potential node 23 and the negative input terminal of the voltage comparator 130. As described above, the DC voltage Vt may be supplied from the voltage source 135 disposed outside the semiconductor device 100A.

The semiconductor device 100A illustrated in FIG. 2 also operates in response to the changes on the control signal SIN for controlling the ON/OFF of the switching element 10b in the same manner as that described with reference to FIGS. 4 and 5. In other words, the semiconductor device 100A may be applied to both the low-side switching element 10a and the high-side switching element 10b with the same circuit configuration.

Second Embodiment

In the second embodiment, a circuit configuration capable of easily adjusting a determination voltage for detecting the unsaturated state will be described.

Figure 6:
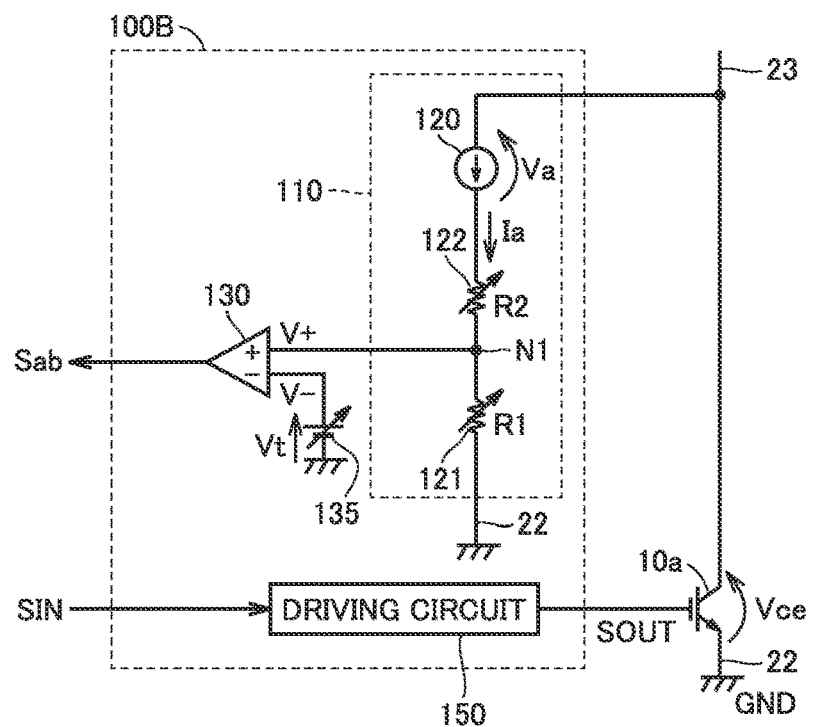
FIG. 6 is a first circuit diagram illustrating a configuration of a semiconductor device according to a second embodiment.

FIG. 6 is a first circuit diagram illustrating the configuration of a semiconductor device according to a second embodiment.

With reference to FIG. 6, a semiconductor device 100B according to the second embodiment differs from the semiconductor device 100A according to the first embodiment in the configuration of the detection circuit 110. Specifically, in the second embodiment, the detection circuit 110 further includes a resistor element 122 connected in series with the current source 120 between the intermediate potential node 23 and the node N1 as compared with the configuration of FIG. 1. It is preferable that an electric resistance value R2 of the resistor element 122 may be variably adjusted by trimming or the like. The configuration of the other portions of the semiconductor device 100B is the same as that of the semiconductor device 100A. The resistor element 122 corresponds to an embodiment of a "second resistor element".

In the detection circuit 110 according to the second embodiment, due to the addition of the resistor element 122 (having an electrical resistance value R2), the above-described expression (1) is transformed into the following expression (4):

$$Vth = Va1 + (R1+R2) \times Ia1 \quad (4)$$

Also in the second embodiment, if the DC voltage Vt is expressed by using the current Ia1 in the expression (1) in the same manner as the expression (2) at the time when Vce=Vth, the determination voltage Vth may be expressed by the following expression (5):

$$Vth = Va1 + Vt \times (R1+R2)/R1 \quad (5)$$

In the second embodiment, Sab is set to the H level when Vce>Vth as expressed by the expression (5), whereas Sab is set to the L level when Vce<Vth. As seen from the expression (5), in the second embodiment, the determination voltage Vth may be adjusted by the DC voltage Vt of the voltage source 135, the electric resistance value R1 of the resistor element 121 and the electric resistance value R2 of the resistor element 122.

The operation of the semiconductor device 100B according to the second embodiment is the same as that of the semiconductor device 100A except the setting of the determination voltage Vth. Therefore, in the semiconductor device 100B according to the second embodiment, in addition to the effect of the semiconductor device 100A according to the first embodiment, the determination voltage Vth may be easily adjusted.

Figure 7:
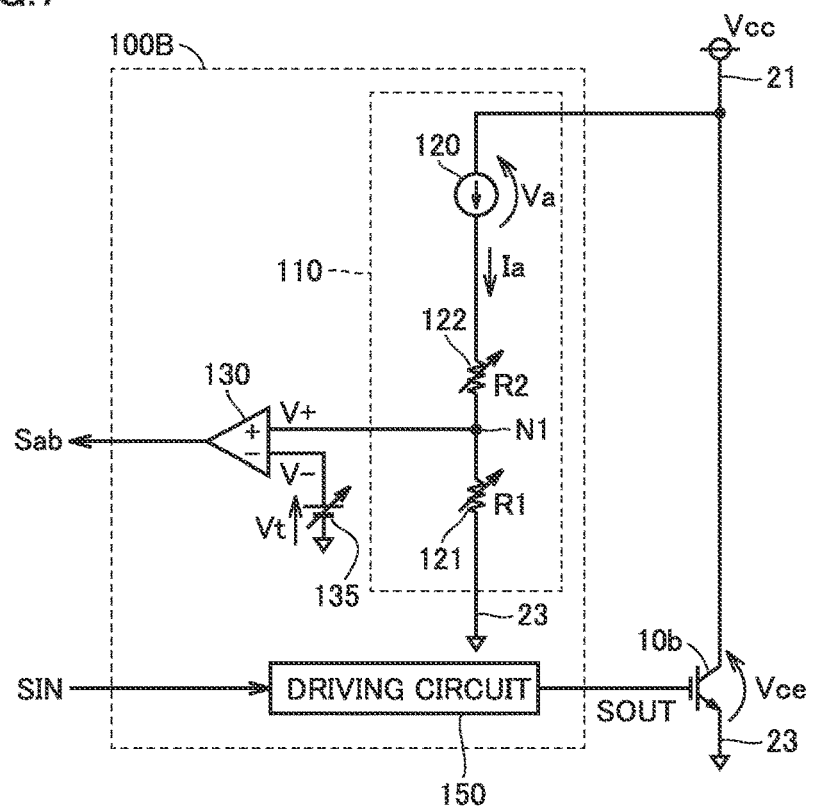
FIG. 7 is a second circuit diagram illustrating the configuration of the semiconductor device according to the second embodiment.

FIG. 7 illustrates a circuit configuration when the semiconductor device 100B according to the second embodiment is applied to the high-side switching element 10b.

With reference to FIG. 7, the semiconductor device 100B according to the second embodiment may be applied to the high-side switching element 10b with the same circuit configuration as that of FIG. 6. In this case, the high potential node 21 in the circuit configuration of FIG. 7 corresponds to the intermediate potential node 23 in the circuit configuration of FIG. 6, and the intermediate potential node 23 in the circuit configuration of FIG. 7 corresponds to the low potential node 22 in the circuit configuration of FIG. 6.

In FIG. 7, the unsaturated state of the switching element 10b may be detected by comparing the collector-emitter voltage Vce of the high-side switching element 10b with the determination voltage Vth. Similarly to FIG. 6, the determination voltage Vth may be adjusted by the DC voltage Vt of the voltage source 135, the electric resistance value R1 of the resistor element 121 and the electric resistance value R2 of the resistor element 122.

In other words, the semiconductor device 100B may also be applied to both the low-side switching element 10a and the high-side switching element 10b with the same circuit configuration. In the second embodiment, it is also possible to change the sequence of the current source 120 and the resistor element 122 connected in series in the circuit configuration of FIGS. 6 and 7.

Third Embodiment

A preferable example configuration of the current source 120 of the detection circuit 110 according to a third embodiment will be described.

Figure 8:
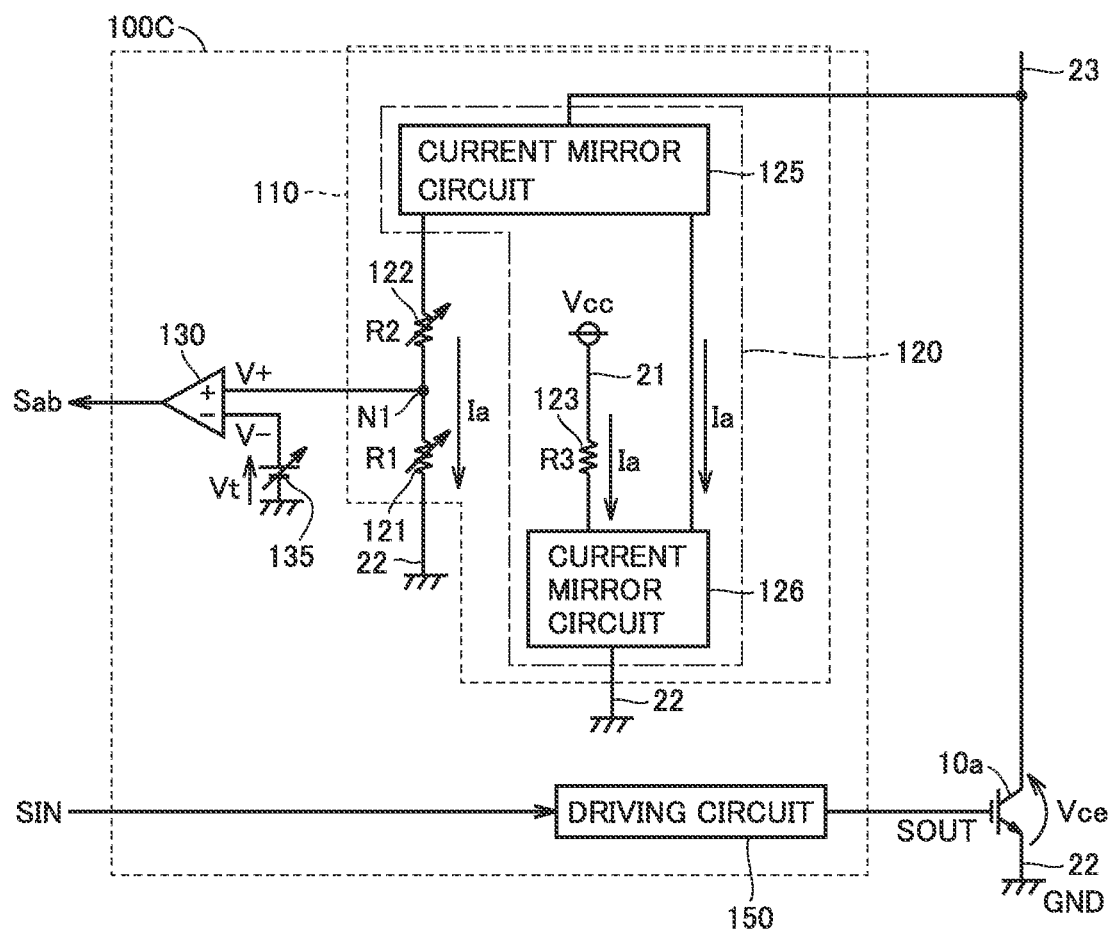
FIG. 8 is a circuit diagram illustrating a configuration of a semiconductor device according to a third embodiment.

FIG. 8 is a circuit diagram illustrating a configuration of a semiconductor device according to the third embodiment.

With reference to FIG. 8, a semiconductor device 100C according to the third embodiment shows an example configuration of a current source 120 included in the detection circuit 110 of the semiconductor device 100B according to the second embodiment.

Specifically, in the third embodiment, the current source 120 of the detection circuit 110 includes a current mirror circuit 125 and a current mirror circuit 126. The other configuration of FIG. 8 is the same as that of the second embodiment (FIG. 6), and the detailed description thereof will not be repeated. In other words, the detection signal Sab is generated in the semiconductor device 100C in the same manner as in the semiconductor device 100B according to the second embodiment, and thus, the occurrence of Vce>Vth, in other words, the occurrence of an unsaturated state of the switching element 10a may be detected in the same manner as in the second embodiment.

Further, according to the third embodiment, since the current source 120 is configured to include the current mirror circuits, the output current Ia is stabilized, and thereby, it is possible to improve the accuracy of detecting whether or not Vce>Vth. As to be described hereinafter, the constituent elements (the transistors and the resistor elements) of the current mirror circuits 125 and 126 may also be disposed on the IC constituting the semiconductor device 100C, similarly to the voltage comparator 130 and the driving circuit 150.

Figure 9:
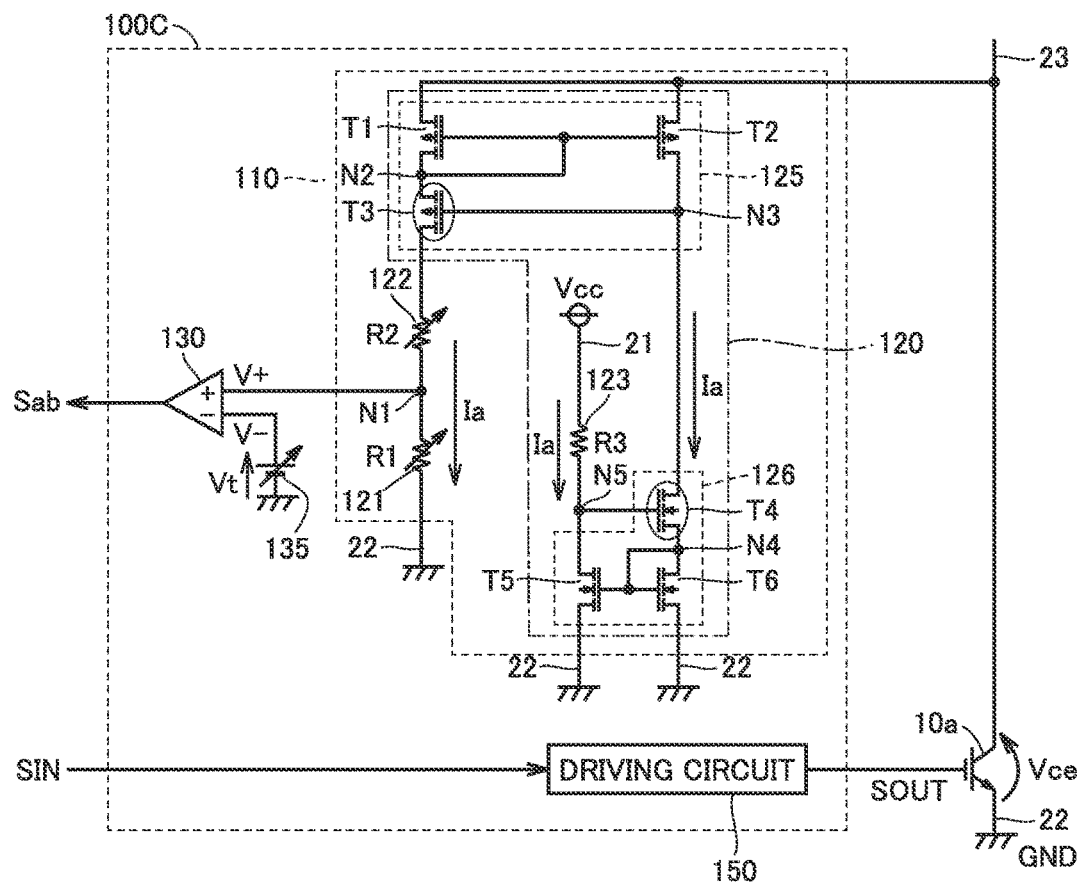
FIG. 9 is a circuit diagram for explaining an example configuration of a current mirror circuit illustrated in FIG. 8.

FIG. 9 illustrates a preferable example configuration of the current mirror circuits 125 and 126 illustrated in FIG. 8.

With reference to FIG. 9, the current source 120 includes transistors T1 to T3 that constitute the current mirror circuit 125, transistors T4 to T6 that constitute the current mirror circuit 126, and a resistor element 123.

In the current mirror circuit 125, the transistor T1 is connected between the intermediate potential node 23 (the collector of the switching element 10a) and a node N2, the transistor T2 is connected between the intermediate potential node 23 and a node N3, and the transistor T3 is connected between the node N2 and the resistor element 121. The gate of the transistor T1 and the gate of the transistor T2 are connected to the node N2, and the gate of the transistor T3 is connected to the node N3.

In the current mirror circuit 126, the transistor T4 is connected between the node N3 and a node N4, the transistor T5 is connected between the node N4 and the low potential node 22, and the transistor T5 is connected between the node N5 and the low potential node 22 (the emitter of the switching element 10a). The gate of the transistor T5 and the gate of the transistor T6 are connected to the node N4. The gate of the transistor T4 is connected to the node N5, and the node N5 is connected to the high potential node 21 via the resistor element 123 (having an electrical resistance value R3).

According to the example configuration of FIG. 9, since each of the current mirror circuits 125 and 126 is configured as a Wilson-type current mirror circuit, it is possible to improve the accuracy of detecting the output current Ia of the current source 120. As a result, it is possible to improve the accuracy of setting the determination voltage Vth, which makes it possible to improve the accuracy of detecting whether or not Vce>Vth, in other words, the accuracy of detecting an unsaturated state of the switching element.

In the example configuration of FIG. 9, since each of the transistors T3 and T4 is constituted by a high breakdown voltage transistor, it is possible to ensure the insulation of the detection circuit 110.

It should be noted that the current source 120 in the semiconductor device 100B illustrated in FIG. 7 may be configured in the same manner as that described with reference to FIGS. 8 and 9. In other words, the semiconductor device 100C according to the third embodiment may also be applied to both the low-side switching element 10a and the high-side switching element 10b with the same circuit configuration.

The semiconductor device according to the third embodiment may be realized by configuring the current source 120 in the semiconductor device 100A of the first embodiment (FIGS. 1 and 2) to include the current mirror circuits described with reference to FIGS. 8 and 9.

Fourth Embodiment

In the fourth embodiment, the description will be given on a protection circuit that will be initialized in response to the detection of an unsaturated state of the switching element as described in the first to third embodiments.

Figure 10:
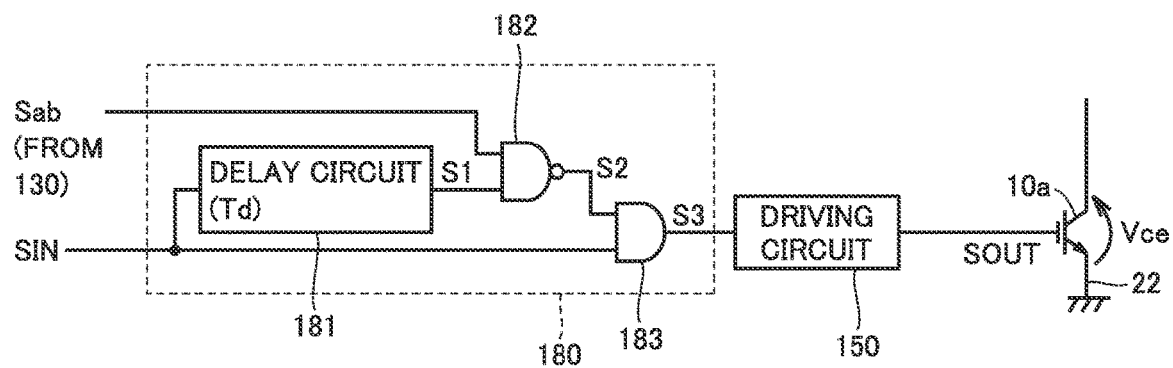
FIG. 10 is a circuit diagram illustrating an example configuration of a protection circuit included in a semiconductor device according to a fourth embodiment.

FIG. 10 is a circuit diagram illustrating an example configuration of a protection circuit 180 included in the semiconductor device according to the fourth embodiment.

The semiconductor device according to the fourth embodiment is different from the semiconductor devices 100A to 100C according to the first to third embodiments in that the control signal SIN is input to the driving circuit 150 via the protection circuit 180.

With reference to FIG. 10, the protection circuit 180 includes a delay circuit 181, a NAND gate 182, and an AND gate 183.

The delay circuit 181 outputs a delay signal S1 by adding a delay time Td to the control signal SIN. The NAND gate 182 outputs a signal S2 in accordance with the result of a NAND operation performed on the detection signal Sab output by the voltage comparator 130 and the delay signal S1. The delay circuit 181 may be constituted by, for example, a plurality of (an even number of) inverters (NOT gates) connected in series.

The AND gate 183 generates a control signal S3 to be input to the driving circuit 150 in accordance with the result of an AND operation performed on the control signal SIN that does not pass through the delay circuit 181 and the signal S2. The driving circuit 150 generates a gate signal SOUT in accordance with the control signal S3.

Next, an example operation of the semiconductor device according to the fourth embodiment will be described with reference to FIGS. 11 and 12. Similar to FIG. 4, FIG. 11 illustrates an example waveform diagram during the normal operation.

Figure 11:
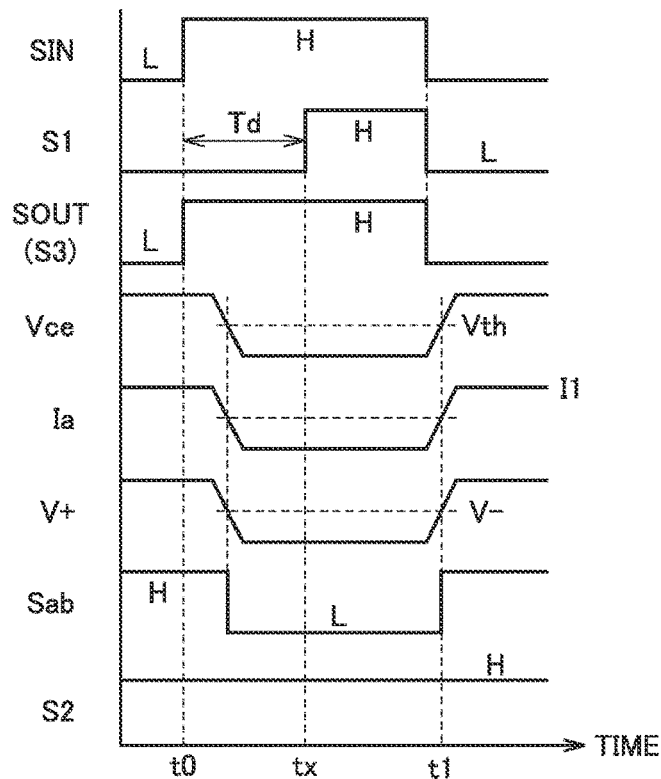
FIG. 11 is a first waveform diagram illustrating an example operation of the semiconductor device according to the fourth embodiment.

With reference to FIG. 11, when the control signal SIN is changed from the L level to the H level at time to as in FIG. 4, Vce, Ia, V+ and the detection signal Sab change as in FIG. 4. As described above, in the normal operation, the detection signal Sab is changed from the H level to the L level in response to the decrease of Vce. The delay signal S1 is changed from the L level to the H level at time tx after the delay time Td given by the delay circuit 181 has elapsed from time t0. The delay time Td is determined in advance so as to be longer than the circuit operation time required from the start of turn-on (time t0) until the detection signal Sab is changed to the L level during the normal operation.

From time t0 to time tx, the delay signal S1 is set to the L level, whereby the signal S2 output from the NAND gate 182 is maintained at the H level. Further, from time tx to time t1, the detection signal Sab is set to the L level, whereby the signal S2 is maintained at the H level.

Therefore, the signal S2 input to the AND gate 183 during the normal operation is always maintained at the H level. Thus, the control signal S3 input to the driving circuit 150 has the same waveform as the control signal SIN. As a result, the switching elements 10a and 10b are turned on and off in response to the control signal SIN by the gate signal SOUT from the driving circuit 150 of the semiconductor device according to the fourth embodiment.

Figure 12:
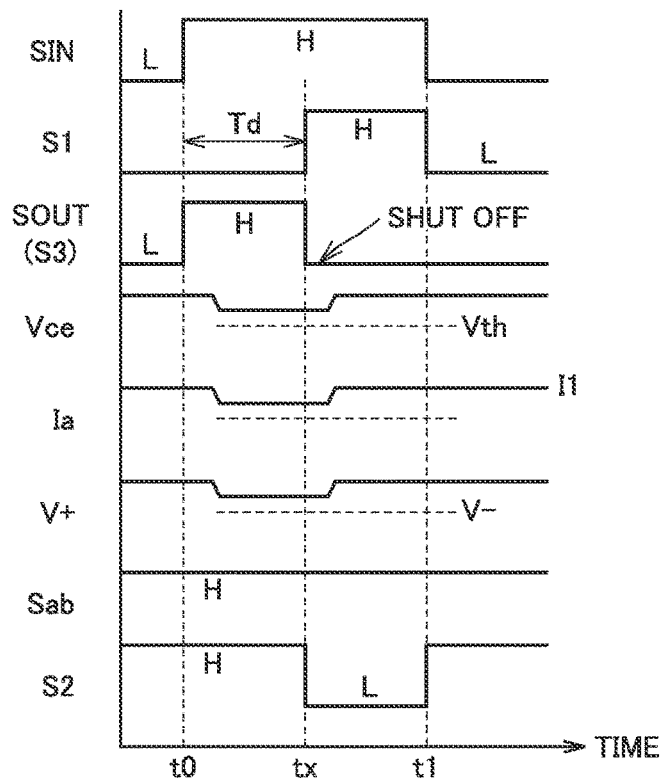
FIG. 12 is a second waveform diagram illustrating an example operation of the semiconductor device according to the fourth embodiment.

On the other hand, FIG. 12 illustrates an example operation when an unsaturated state occurs in the switching element 10a as in FIG. 5.

With reference to FIG. 12, similar to FIGS. 5 and 11, the control signal SIN is changed from the L level to the H level at time t0. The waveform of the delay signal S1 is the same as that in FIG. 11 (during the normal operation). Therefore, the signal S2 is maintained at the L level until time tx at which the delay signal S1 is changed to the H level.

Therefore, at least until time tx, the control signal S3 input to the driving circuit 150 is the same as the control signal SIN, whereby the switching elements 10a and 10b are turned on as in FIG. 11.

The behaviors of Vce, Ia, V+ and the detection signal Sab at the time where an unsaturated state occurs in the switching elements 10a and 10b are the same as those in FIG. 5. In other words, the detection signal Sab is maintained at the H level during the period in which the control signal SIN is maintained at the H level.

As a result, after time tx, the signal S2 output from the NAND gate 182 is changed to the L level. In response, the control signal S3 output from the AND gate 183 is set to the L level, and thereby the switching elements 10a and 10b are forcibly shut off (cut off) due to the detection of the unsaturated state. Thus, the switching elements 10a and 10b may be protected from the overcurrent.

As described above, according to the semiconductor device of the fourth embodiment, in addition to the effects of the semiconductor device according to each of the first embodiment to the third embodiment, it is possible to realize a protection function so as to automatically shut off the switching element in response to the detection of an unsaturated state.

The protection circuit 180 may be a logic circuit such as a CMOS (Complementary Metal Oxide Semiconductor) logic circuit constituted by transistors on the IC constituting each of the semiconductor devices 100A to 100C. Thus, the protection circuit 180 may be mounted on the same integrated circuit as the detection circuit 110, the voltage comparator 130 and the driving circuit 150. Alternatively, the protection circuit 180 may be provided outside the semiconductor device (IC), and a signal corresponding to the control signal S3 may be input to the driver circuit 150 from the outside of the semiconductor device.

In the embodiments of the present disclosure, an IGBT is exemplified as the switching elements 10a and 10b, but by applying the semiconductor device according to the first to fourth embodiments to the switching element other than the IGBT used in the high-side arm and the low-side arm, it is possible to detect a voltage abnormality between the positive electrode and the negative electrode when the switching elements 10a and 10b are turned on while ensuring the insulation.

Although the embodiments of the present invention have been described, it should be understood that the embodiments disclosed herein are illustrative and not restrictive in all respects. It is intended that the scope of the present invention is indicated by the claims, and includes all modifications within the meaning and range equivalent to the claims.

What is claimed is:

1. A semiconductor device comprising:
   a detection circuit connected between a positive electrode and a negative electrode of a semiconductor switching element,
   the detection circuit including a current source and a first resistor element which are connected in series via a first node between the positive electrode and the negative electrode, the first resistor element having a first electrical resistance value,
   the current source operating such that an output current of the current source increases toward a saturated constant value as a voltage of the positive electrode with respect to a voltage of the negative electrode becomes higher,
   the semiconductor device further comprising a voltage comparator to output a comparison result between a DC voltage input to a second node and a voltage of the first node,
   the DC voltage and the first electrical resistance value being set in such a manner that when an inter-electrode voltage between the positive electrode and the negative electrode becomes higher than a predefined determination voltage, the voltage of the first node is higher than the DC voltage, and
   the detection circuit and the voltage comparator being mounted on the same integrated circuit.

2. The semiconductor device according to claim 1, wherein
   the detection circuit further includes a second resistor element connected in series with the current source between the positive electrode and the first node,
   the second resistor element has a second electrical resistance value,
   the first electrical resistance value, the second electrical resistance value, and the DC voltage are set in such a manner that when the inter-electrode voltage becomes higher than the determination voltage, the voltage of the first node is higher than the DC voltage.

3. The semiconductor device according to claim 1, wherein the current source includes a diode-connected field effect transistor.

4. The semiconductor device according to claim 1, further including a driving circuit that drives a control electrode of the semiconductor switching device,
   wherein the driving circuit is mounted on the same integrated circuit as the detection circuit and the voltage comparator.

5. The semiconductor device according to claim 4, further including a protection circuit that receives a first control signal for controlling the turning on or turning off of the semiconductor switching element and an output signal from the voltage comparator and outputs a second control signal to the driving circuit,
   wherein the second control signal is generated to instruct the driving circuit to turn off the semiconductor switching element when the inter-electrode voltage does not become lower than the determination voltage even if the first control signal is changed from a first level indicating the turning off of the semiconductor switching element to a second level indicating the turning on of the semiconductor switching element.

6. The semiconductor device according to claim 5, wherein
   the protection circuit is mounted on the same integrated circuit as the driving circuit.

7. The semiconductor device according to claim 3, the diode-connected field effect transistor being diode-connected so as to flow a current in a direction from the positive electrode toward the first node.

8. The semiconductor device according to claim 1, wherein an unsaturated state of the semiconductor switching element is detected when the voltage of the first node is higher than the DC voltage during an ON state of the semiconductor switching element.

9. The semiconductor device according to claim 3, wherein an unsaturated state of the semiconductor switching element is detected when the voltage of the first node is higher than the DC voltage during an ON state of the semiconductor switching element.

10. A semiconductor device comprising:
    a detection circuit connected between a positive electrode and a negative electrode of a semiconductor switching element,
    the detection circuit including a current source and a first resistor element which are connected in series via a first node between the positive electrode and the negative electrode, the first resistor element having a first electrical resistance value,
    the semiconductor device further comprising a voltage comparator to output a comparison result between a DC voltage input to a second node and a voltage of the first node,
    the DC voltage and the first electrical resistance value being set in such a manner that when an inter-electrode voltage between the positive electrode and the negative electrode becomes higher than a predefined determination voltage, the voltage of the first node is higher than the DC voltage, the detection circuit and the voltage comparator being mounted on the same integrated circuit, and the current source includes a plurality of field effect transistors constituting a current mirror circuit.

11. The semiconductor device according to claim 10, wherein an unsaturated state of the semiconductor switching element is detected when the voltage of the first node is higher than the DC voltage during an ON state of the semiconductor switching element.

* * * * *